(12) United States Patent
Morita (10) Patent No.: US 8,248,042 B2
(45) Date of Patent: Aug. 21, 2012

(54) POWER CONVERTER

(75) Inventor: Tatsuo Morita, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/336,621

(22) Filed: Dec. 23, 2011

(65) Prior Publication Data

US 2012/0099357 A1    Apr. 26, 2012

Related U.S. Application Data (63) Continuation of application No. PCT/JP2010/000054, filed on Jan. 6, 2010.

(30) Foreign Application Priority Data

Jun. 26, 2009   (JP) ................ 2009-152180

(51) Int. Cl.
*G05F 1/00* (2006.01)
*H02M 7/5387* (2007.01)

(52) U.S. Cl. .......... 323/222; 363/132

(58) Field of Classification Search .......... 323/222–224; 363/131–132
See application file for complete search history.

(56) References Cited

U.S. PATENT DOCUMENTS

| 5,677,617 | A | 10/1997 | Tokai et al. | |
|---|---|---|---|---|
| 5,731,689 | A * | 3/1998 | Sato | 363/132 |
| 6,392,908 | B2 * | 5/2002 | Miyazaki et al. | 363/132 |
| 6,943,445 | B2 * | 9/2005 | Shirakawa et al. | 257/724 |
| 7,245,116 | B2 * | 7/2007 | Tateno et al. | 323/316 |
| 7,262,461 | B1 * | 8/2007 | Yu et al. | 257/330 |
| 7,795,855 | B2 * | 9/2010 | Su et al. | 323/284 |
| 7,915,870 | B2 * | 3/2011 | Grandry | 323/222 |
| 7,920,396 | B2 * | 4/2011 | Knight | 363/127 |
| 2003/0098462 | A1 | 5/2003 | Yoshida | |
| 2004/0080969 | A1 * | 4/2004 | Franck | 363/132 |
| 2005/0012541 | A1 | 1/2005 | Watanabe | |
| 2007/0196993 | A1 | 8/2007 | Iwakami et al. | |
| 2008/0149940 | A1 | 6/2008 | Shibata et al. | |

FOREIGN PATENT DOCUMENTS

| JP | 2007-208036 | 8/2007 |
|---|---|---|
| JP | 2007-281551 | 10/2007 |
| JP | 2008-258419 | 10/2008 |

OTHER PUBLICATIONS

International Search Report issued in International Patent Application No. PCT/JP2010/000054 dated Feb. 9, 2010.

* cited by examiner

*Primary Examiner* — Jue Zhang
(74) *Attorney, Agent, or Firm* — McDermott Will & Emery LLP (57) ABSTRACT

A power converter includes an input terminal configured to be connected to a power supply, an output terminal, and a first switching element coupled between the input terminal and the output terminal. The first switching element includes a semiconductor multilayer structure formed on a substrate and made of a nitride semiconductor, a gate electrode formed on the semiconductor multilayer structure, a first and a second ohmic electrode, and a back electrode formed on a back surface of the substrate. A potential is supplied from the power supply connected to the input terminal to the back electrode so that a potential difference between the back surface and the second ohmic electrode is reduced. When the first switching element is in the on-state, a positive voltage bias is applied to the back electrode.

11 Claims, 5 Drawing Sheets

POWER CONVERTER

CROSS-REFERENCE TO RELATED APPLICATIONS

This is a continuation of PCT International Application PCT/JP2010/000054 filed on Jan. 6, 2010, which claims priority to Japanese Patent Application No. 2009-152180 filed on Jun. 26, 2009. The disclosures of these applications including the specifications, the drawings, and the claims are hereby incorporated by reference in their entirety.

BACKGROUND

The present disclosure relates to power converters, and more particularly, to power converters made of nitride semiconductors.

The global warming issue has led to a demand for electronic devices which save more energy. To meet this demand, it is desired to improve the power conversion efficiency of power converters, such as a power supply circuit, an inverter circuit, etc., which consume a large amount of power. The power conversion efficiency of the power converter depends most largely on the loss of power in a power device for power conversion, such as an insulated gate bipolar transistor (IGBT), a metal-oxide-semiconductor field-effect transistor (MOSFET), etc. If the loss in the power device is reduced, the power conversion efficiency of the power converter can be significantly improved. There are two losses in the power device: a conduction loss caused by conduction of the device; and a switching loss caused by switching of the device. The conduction loss can be reduced by using an element having a smaller on-state resistance, and the switching loss can be reduced by using an element which switches at higher speed. Therefore, attempts have been made to develop a power device having a higher switching speed and a lower on-state resistance.

However, conventional power devices are made of silicon (Si), and the Si material limit has been almost reached, and therefore, it has already been difficult to reduce the on-state resistance and increase the switching speed. In order to reduce the conduction loss and switching loss beyond the Si material limit, a so-called wide-gap semiconductor element has been contemplated which is made of a nitride semiconductor (e.g., gallium nitride (GaN) etc.), silicon carbide (SiC), etc. The wide-gap semiconductor element has a dielectric strength higher than that of Si by about an order of magnitude. In particular, charge occurs at the heterojunction interface between aluminum gallium nitride (AlGaN) and gallium nitride (GaN) due to spontaneous polarization and piezoelectric polarization. As a result, even if the layers are undoped, a two-dimensional electron gas (2DEG) layer is formed which has a sheet carrier concentration of $1\times10^{13}$ $cm^{-2}$ or more and a mobility of as high as 1000 $cm^2V/sec$ or more. Therefore, an AlGaN/GaN heterojunction electric field effect transistor (hereinafter referred to as a GaN transistor) has been expected to serve as a power switching transistor which achieves a low on-state resistance and a high breakdown voltage.

The GaN transistor has the potential to have characteristics exceeding those of conventional Si devices. However, the GaN transistor has a peculiar phenomenon called current collapse that the on-state resistance increases during switching. It is important to reduce current collapse, which causes the increase in the on-state resistance, in order to further improve the power conversion efficiency of the power converter.

In order to reduce current collapse, a technique of forming the GaN transistor on a conductive substrate to utilize the field plate effect from the back surface has been proposed (see, for example, Japanese Patent Publication No. 2008-258419). Specifically, the GaN transistor is formed on an n+ conductive substrate made of SiC, and the source electrode is formed to penetrate the semiconductor layer to connect the source electrode and the conductive substrate. As a result, the source electrode and the conductive substrate have the same potential, and therefore, the conductive substrate is enabled to function as a field plate from the back surface, whereby it is expected that current collapse can be reduced.

SUMMARY

However, the present inventors have found that the reduction in current collapse is not sufficient even in the conventional GaN transistor in which the source electrode and the conductive substrate have the same potential. Even if the source electrode and the conductive substrate have the same potential, the inherent low on-state resistance of the GaN transistor is not fully exploited, so that the loss in the power converter is not sufficiently reduced.

The present disclosure describes implementations of a highly efficient power converter in which current collapse is reduced and the inherent low on-state resistance of the GaN transistor is exploited.

To achieve the object, a power converter according to the present disclosure includes a GaN transistor having a back electrode and is configured so that when the GaN transistor is in the off-state, a potential difference between the back electrode and the drain electrode is reduced, and when the GaN transistor is in the on-state, a positive voltage bias is applied to the back electrode.

An example power converter includes an input terminal configured to be connected to a power supply, an output terminal, and a first switching element coupled between the input terminal and the output terminal. The first switching element includes a semiconductor multilayer structure formed on a substrate and made of a nitride semiconductor, a gate electrode formed on the semiconductor multilayer structure, a first and a second ohmic electrode formed on both sides of the gate electrode, and a back electrode formed on a surface opposite to the semiconductor multilayer structure of the substrate. When the first switching element is in the off-state, a potential difference between the second ohmic electrode and the back electrode is smaller than a potential difference between the second ohmic electrode and the first ohmic electrode. When the first switching element is in the on-state, a positive voltage bias is applied to the back electrode.

In the example power converter, when the first switching element is in the off-state, a high electric field is not likely to be applied between the substrate and the channel region in the vicinity of the second ohmic electrode. Therefore, electrons which would otherwise be caused by impact ionization do not occur, so that electrons trapped by the semiconductor multilayer structure can be reduced and therefore the occurrence of current collapse can be reduced. When the first switching element is in the on-state, a positive voltage bias is applied to the back electrode. Therefore, electrons trapped at a trap level can be quickly discharged, whereby current collapse can be further reduced. As a result, a highly efficient power converter which utilizes the inherent low on-state resistance of the GaN transistor can be provided. The potential of the back electrode is supplied from the power supply connected to the input terminal, and therefore, additional parts, such as an external power supply etc., for supplying the potential are not required. Therefore, the size of the power converter can be reduced.

In the example power converter, the potential of the back electrode which occurs when the first switching element is in the on-state may be equal to the potential of the back electrode which occurs when the first switching element is in the off-state.

The example power converter may further include an inductor, and a diode configured to be connected in series to the inductor. The power converter may function as a DC-DC converter which converts a voltage applied to the input terminal into a different voltage and output the resulting voltage through the output terminal.

In the example power converter, the inductor may be connected between the input terminal and the second ohmic electrode. The diode may be connected between a connection node between the inductor and the second ohmic electrode, and the output terminal. The power converter may function as a boost-up DC-DC converter which boosts a voltage applied to the input terminal and output the resulting voltage through the output terminal.

In this case, the back electrode may be connected to the output terminal or the input terminal.

The example power converter may further include a half bridge. The half bridge includes the first switching element and a second switching element connected to the first switching element.

In this case, the second switching element may have the same structure as that of the first switching element. The back electrodes of the first and second switching elements may be connected to the input terminal.

The example power converter may further include a second and a third half bridge configured to be connected in parallel to the first half bridge. The power converter may function as a motor drive inverter which drives a three-phase motor.

In the example power converter, the second half bridge may include a third and a fourth switching element. The third half bridge may include a fifth and a sixth switching element. The second, third, fourth, fifth, and sixth switching elements may each have the same structure as that of the first switching element. The back electrodes of the first, second, third, fourth, fifth, and sixth switching elements may be connected to the input terminal.

In the example power converter, the second half bridge may include a third and a fourth switching element. The third half bridge may include a fifth and a sixth switching element. The semiconductor multilayer structure may have an inactive region, and active regions each surrounded by the inactive region and arranged in a matrix of two rows and three columns. The first, second, third, fourth, fifth, and sixth switching elements may be formed in the different respective active regions. The second ohmic electrodes of the first, third, and fifth switching elements may be integrally formed. The first ohmic electrodes of the second, fourth, and sixth switching elements may be integrally formed. The first ohmic electrode of the first switching element and the second ohmic electrode of the second switching element may be integrally formed. The first ohmic electrode of the third switching element and the second ohmic electrode of the fourth switching element may be integrally formed. The first ohmic electrode of the fifth switching element and the second ohmic electrode of the sixth switching element may be integrally formed.

With this configuration, the entire inverter can be mounted on a single chip. As a result, only one interconnect is required to supply a potential to the back electrode, and therefore, the interconnection structure can be simplified. Also, a common electrode can be shared by the switching elements, resulting in a reduction in the chip area.

According to the power converter of the present disclosure, a highly efficient power converter can be provided in which current collapse is reduced and the inherent low on-state resistance of the GaN transistor is exploited.

DETAILED DESCRIPTION

As used herein, the term "AlGaN" means a ternary compound $Al_xGa_{1-x}N$ where $0 \leq x \leq 1$. Multi-element compounds are each denoted by a sequence of symbols of elements constituting the compound, such as AlInN, GaInN, etc. For example, a nitride semiconductor $Al_xGa_{1-x-y}In_yN$ where $0 \leq x \leq 1$, $0 \leq y \leq 1$, and $x+y \leq 1$ is abbreviated to AlGaInN. As used herein, the term "undoped" with respect to a material means that no impurity is intentionally introduced into the material. As used herein, the term "p+" with respect to a material means that the material contains a high concentration of p-type carriers.

Figure 1:
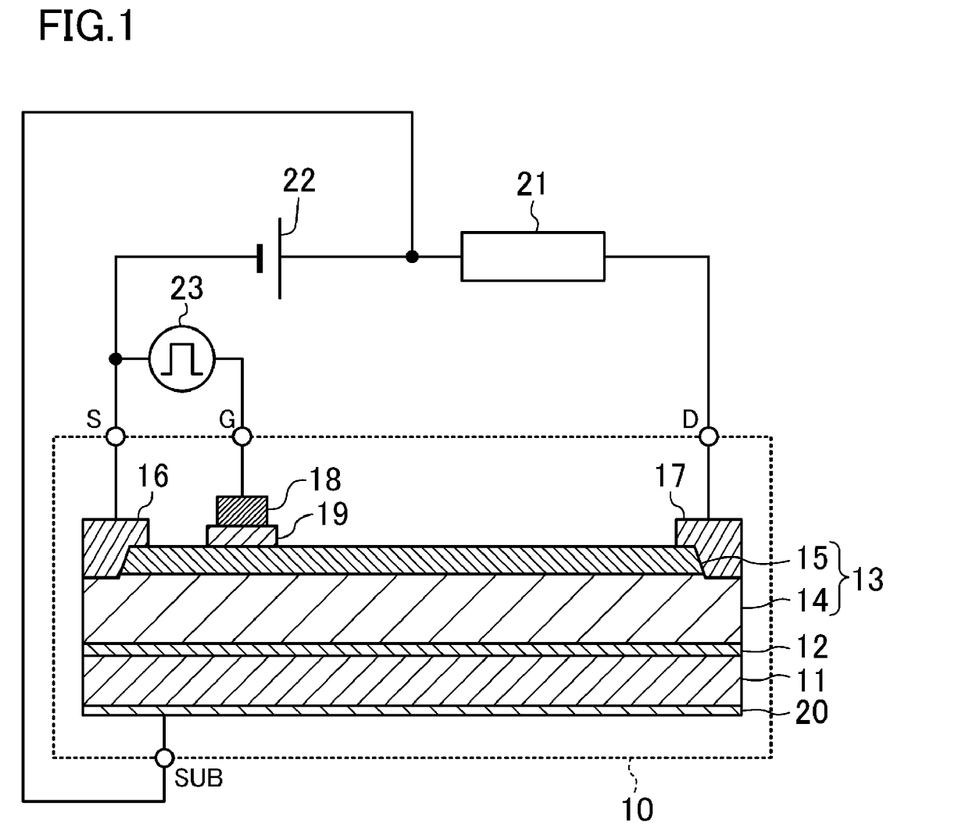
FIG. 1 is a cross-sectional view showing a configuration of a GaN transistor for use in a power converter according to an embodiment.

An embodiment will be described with reference to the accompanying drawings. FIG. 1 is a cross-sectional view showing a configuration of a GaN transistor 10 for use in a power converter according to the embodiment. In FIG. 1, a power supply, a load, and a gate signal source which form a peripheral circuit for switching the GaN transistor 10 are also shown.

As shown in FIG. 1, a semiconductor multilayer structure 13 is formed on a conductive substrate 11 made of silicon (Si) with a buffer layer 12 made of aluminum nitride (AlN) and having a thickness of 100 nm being interposed therebetween. The semiconductor multilayer structure 13 includes a first nitride semiconductor layer 14 and a second nitride semiconductor layer 15 which is provided on the first nitride semiconductor layer 14. The second nitride semiconductor layer 15 has a band gap larger than that of the first nitride semiconductor layer 14. The first nitride semiconductor layer 14 may be, for example, an undoped GaN layer having a thickness of about 2 μm. The second nitride semiconductor layer 15 may be, for example, an undoped AlGaN layer having a thickness of about 20 nm. Charge occurs in the first nitride semiconductor layer 14 in the vicinity of a heterointerface between the first and second nitride semiconductor layers 14 and 15 due to spontaneous polarization and piezoelectric polarization. As a result, a channel region is formed which is a two-dimensional electron gas (2DEG) layer having a sheet carrier concentration of $1 \times 10^{13}$ cm$^{-2}$ or more and a mobility of 1000 cm$^2$ V/sec or more.

A gate electrode 18 is formed on the semiconductor multilayer structure 13 with a p-type semiconductor layer 19 being interposed therebetween. The gate electrode 18 includes laminated layers of palladium (Pd) and gold (Au) and forms an ohmic contact with the p-type semiconductor layer 19. A first ohmic electrode 16 serving as a source electrode and a second ohmic electrode 17 serving as a drain electrode are formed on the semiconductor multilayer structure 13 on both sides of the gate electrode 18. The first and second ohmic electrodes 16 and 17 each include laminated layers of titanium (Ti) and aluminum (Al) and form an ohmic contact with the channel region. In FIG. 1, in order to reduce the contact resistance, for example, a portion of the second nitride semiconductor layer 15 is removed and the first nitride semiconductor layer 14 is hollowed out to a depth of about 40 nm, whereby the first and second ohmic electrodes 16 and 17 contact an interface between the second nitride semiconductor layer 15 and the first nitride semiconductor layer 14.

The p-type semiconductor layer 19 has a thickness of 300 nm and is made of p-type GaN doped with magnesium (Mg). The p-type semiconductor layer 19 and the second nitride semiconductor layer 15 form PN junction. As a result, even when a voltage applied to the gate electrode 18 is 0 V, a depletion layer is extended in the second nitride semiconductor layer 15 and the first nitride semiconductor layer 14 from the p-type semiconductor layer 19 toward the second ohmic electrode 17 in a portion closer to the substrate 11. Therefore, a current flowing through the channel region is shut off, so that normally-off operation can be performed. The p-type semiconductor layer 19 may alternatively be an AlGaN layer. If normally-off operation is not required, the p-type semiconductor layer 19 may not be provided. Normally-off operation may be provided by adjusting the thickness of the second nitride semiconductor layer 15 or forming a gate recess instead of providing the p-type semiconductor layer 19. A distance between the p-type semiconductor layer 19 and the second ohmic electrode 17 may be designed so that the GaN transistor 10 can withstand a maximum voltage applied thereto.

A back electrode 20 for applying an external potential to the substrate 11 is formed on a surface (back surface) opposite to the semiconductor multilayer structure 13 of the substrate 11. The back electrode 20 includes laminated layers of chromium (Cr) and nickel (Ni) which are successively stacked on the substrate 11. The back electrode 20 serves as a separate electrode which is not connected to the first and second ohmic electrodes 16 and 17 via a penetrating electrode, etc. Therefore, the potential of the back electrode 20 can be set to any value which is different from those of the first and second ohmic electrodes 16 and 17.

One of the factors that may be considered is responsible for current collapse in the GaN transistor is that electrons are trapped in the second nitride semiconductor layer 15 made of AlGaN or the first nitride semiconductor layer 14 made of GaN. The trapping of electrons in the AlGaN layer or the GaN layer may be caused by generation of electrons due to impact ionization. When the GaN transistor is in the off-state, the drain electrode is at a high potential. On the other hand, the substrate is typically at a ground potential or a floating potential. Even if the source electrode is formed as a through electrode etc. to connect the substrate and the source electrode, the substrate has the same potential as that of the source electrode, i.e., the potential of the substrate is lower than that of the drain electrode. Therefore, a high electric field is applied between the substrate and the channel region in the vicinity of the drain electrode, so that electrons are generated due to impact ionization. The generated electrons are trapped at a trap level in the semiconductor multilayer structure. If electrons are trapped by the semiconductor multilayer structure when the GaN transistor is in the off-state, then when the GaN transistor is transitioned to the on-state, a depletion layer is formed in the semiconductor multilayer structure, so that the drain current is confined. Therefore, current collapse occurs, which increases the on-state resistance.

However, the GaN transistor 10 of this embodiment has the back electrode 20 and the back electrode 20 is separated from the first and second ohmic electrodes 16 and 17, and therefore, the potential of the back electrode 20 can be freely set. Therefore, the electric field intensity between the back electrode 20 and the second ohmic electrode 17 can be reduced. For example, a direct-current power supply 22 which supplies power and a load 21 are connected in series between an S-terminal connected to the first ohmic electrode 16 and a D-terminal connected to the second ohmic electrode 17. The negative terminal of the direct-current power supply 22 is connected to the S-terminal. A gate signal source 23 for driving the gate electrode 18 is connected between the S-terminal and a G-terminal connected to the gate electrode 18. An SUB terminal connected to the back electrode 20 is connected to the positive terminal of the direct-current power supply 22.

With these connections, when the GaN transistor 10 is in the off-state, the potential of the D-terminal, i.e., the potential of the second ohmic electrode 17, is the same as that of the positive terminal of the direct-current power supply 22. On the other hand, the potential of the back electrode 20 is also supplied from the direct-current power supply 22, and therefore, the potential of the SUB terminal, i.e., the potential of the back electrode 20, is also the same as that of the positive terminal of the direct-current power supply 22. Therefore, a high electric field does not occur between the substrate 11 and the channel region in the vicinity of the second ohmic electrode 17. Therefore, electrons which would otherwise be caused by impact ionization do not occur, so that the trapping of electrons in the semiconductor multilayer structure 13 is significantly reduced, whereby the occurrence of current collapse can be reduced. On the other hand, even when the GaN transistor 10 is in the on-state, the potential of the SUB terminal, i.e., the potential of the back electrode 20, is the same as that of the positive terminal of the direct-current power supply 22, i.e., is kept constant at the same potential as that which is obtained when the GaN transistor 10 is in the off-state.

In order to reduce current collapse, when the GaN transistor 10 is in the off-state, the difference in potential between the second ohmic electrode 17 and the back electrode 20 may be set to be smaller than the difference in potential between the second ohmic electrode 17 and the first ohmic electrode 16. Therefore, for example, if the potential of the second ohmic electrode 17 is higher than that of the first ohmic electrode 16, a potential higher than that of the first ohmic electrode 16 may be supplied to the back electrode 20. As a result, the electric field between the substrate 11 and the channel region in the vicinity of the second ohmic electrode 17 can be reduced, whereby the occurrence of electrons due to impact ionization can be reduced. Therefore, electrons trapped at the trap level in the semiconductor multilayer structure 13 can be reduced, whereby current collapse can be reduced.

On the other hand, when the GaN transistor 10 is in the on-state, then if a positive voltage bias is applied to the back electrode 20, electrons trapped in the semiconductor multilayer structure 13 are more easily discharged, whereby current collapse can be further reduced. Also, when the GaN transistor 10 is in the on-state, then if a positive voltage bias is applied to the back electrode 20, the back electrode 20 functions as a back gate, whereby the channel is opened to a greater degree and therefore the on-state resistance can be advantageously reduced.

If the back electrode 20 and the second ohmic electrode 17 are connected together, then when the GaN transistor 10 is in the on-state, the potential of the back electrode 20 is disadvantageously the same as the on-state voltage of the GaN transistor 10. Therefore, when the GaN transistor 10 is in the on-state, the back electrode 20 cannot be biased to a positive voltage. In the power converter of this embodiment, however, the back electrode 20 is separated from the second ohmic electrode 17 and the SUB terminal is connected to the positive terminal of the direct-current power supply 22 rather than the D-terminal. Therefore, when the GaN transistor 10 is in the off-state, the potential of the back electrode 20 can be caused to be higher than that of the second ohmic electrode 17, and in addition, when the GaN transistor 10 is in the on-state, a positive voltage bias can be applied to the back electrode 20. Therefore, the current collapse reduction effect can be enhanced. Note that the SUB terminal may be connected in any manner as long as, when the GaN transistor 10 is in the off-state, the potential difference between the second ohmic electrode 17 and the back electrode 20 can be caused to be lower than that between the second ohmic electrode 17 and the first ohmic electrode 16, and when the GaN transistor 10 is in the on-state, a positive voltage bias can be applied to the back electrode 20.

Figure 2:
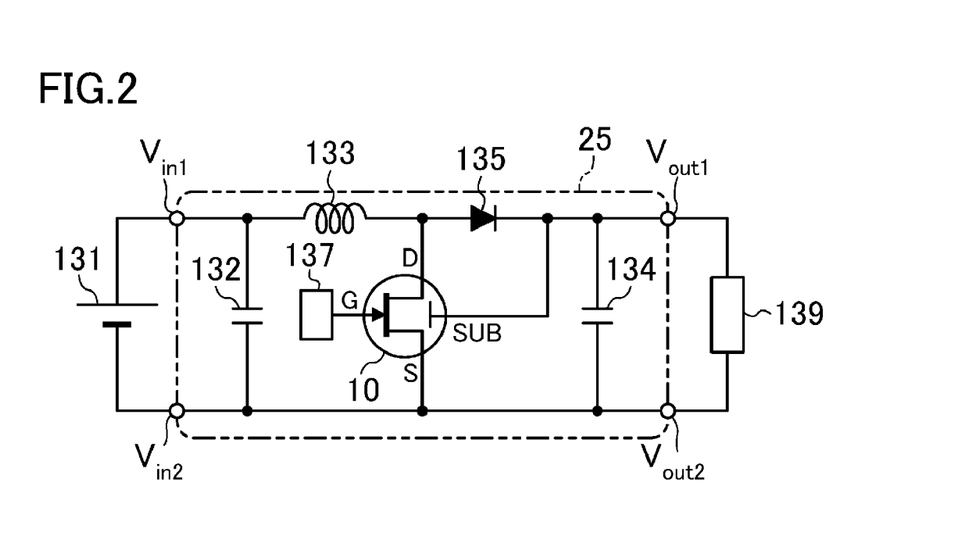
FIG. 2 is a circuit diagram showing the power converter of the embodiment.

A specific example power converter employing the GaN transistor of this embodiment will be described hereinafter. FIG. 2 shows a circuit configuration in which the GaN transistor of this embodiment is used as a boost-up direct current to direct current converter (DC-DC converter). As shown in FIG. 2, a direct-current power supply 131 for supplying power is connected between a first input terminal $V_{in1}$ and a second input terminal $V_{in2}$ of the DC-DC converter 25 which is the power converter. A load 139 is connected between a first output terminal $V_{out1}$ and a second output terminal $V_{out2}$ of the power converter. The second input terminal $V_{in2}$ and the second output terminal $V_{out2}$ are connected together by a ground line.

An inductor 133 for storing energy is connected to the first input terminal $V_{in1}$. A diode 135 is connected in series to the inductor 133. The cathode of the diode 135 is connected to the first output terminal $V_{out1}$. The D-terminal of the GaN transistor 10, which is a switching element, is connected to a connection node between the inductor 133 and the anode of the diode 135. The S-terminal of the GaN transistor 10 is connected to the ground line. The SUB terminal of the GaN transistor 10 is connected to the first output terminal $V_{out1}$. A gate drive circuit 137 is connected to the G-terminal of the GaN transistor 10. A first capacitor 132 is connected between the first input terminal $V_{in1}$ and the ground line, and a second capacitor 134 is connected between the first output terminal $V_{out1}$ and the ground line.

Because the SUB terminal of the GaN transistor 10 is connected to the first output terminal $V_{out1}$, the potential of the substrate electrode of the GaN transistor 10 is maintained higher than or equal to the potential of the second ohmic electrode (drain electrode). Therefore, a high electric field is not applied between the substrate and the channel region in the vicinity of the second ohmic electrode, so that the occurrence of current collapse can be reduced.

In FIG. 2, the SUB terminal is connected to the first output terminal $V_{out1}$ without a resistor etc. being interposed therebetween. However, the SUB terminal may be connected to the first output terminal $V_{out1}$ via a resistor etc. if the potential of the SUB terminal can be maintained higher than or equal to that of the D-terminal, which does not cause a problem. Therefore, a potential may be supplied from the direct-current power supply 131 to the SUB terminal, i.e., the SUB terminal may be connected to the first input terminal $V_{in1}$ rather than the first output terminal $V_{out1}$. Note that a positive voltage bias is also applied to the SUB terminal when the GaN transistor 10 is in the on-state. Because a potential is supplied from the power supply connected to the first input terminal $V_{in1}$ to the SUB terminal, it is not necessary to provide an additional power supply for supplying a potential to the SUB terminal, and therefore, the loss in the power conversion circuit can be reduced without increasing the size of the power conversion circuit.

While FIG. 2 shows a boost-up DC-DC converter, a similar advantage may be obtained in the case of a step-down DC-DC converter if the potential of the SUB terminal is maintained higher than or equal to that of the D-terminal.

Figure 3:
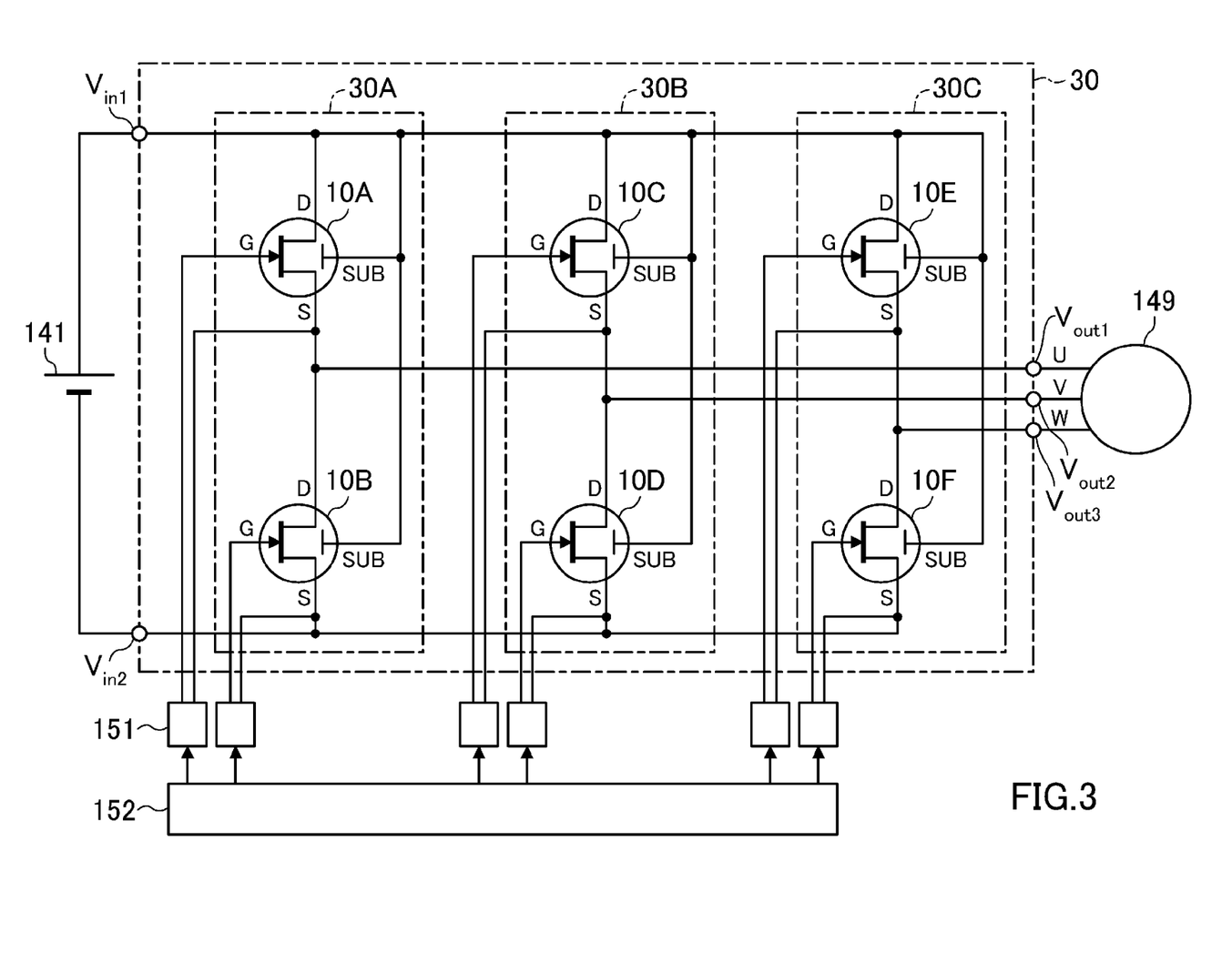
FIG. 3 is a circuit diagram showing a power converter according to a variation of the embodiment.

A variation of the embodiment will be described hereinafter with reference to the drawings. FIG. 3 shows a circuit configuration of a power converter according to the variation. As shown in FIG. 3, the power converter of the variation is an inverter 30 which converts direct-current power into three-phase alternating-current power. In FIG. 3, as an example, the inverter 30 is used to drive a three-phase motor 149. A direct-current power supply 141 is connected between a first input terminal $V_{in1}$ and a second input terminal $V_{in2}$ of the inverter 30. A first output terminal $V_{out1}$, a second output terminal $V_{out2}$, and a third output terminal $V_{out3}$ of the inverter 30 are connected to the U-, V-, and W-phases of the three-phase motor 149, respectively.

The inverter 30 has a first half bridge 30A for driving the U-phase of the three-phase motor 149, a second half bridge 30B for driving the V-phase, and a third half bridge 30C for driving the W-phase. The first half bridge 30A includes a first switching element 10A which is an U-phase high-side switch and a second switching element 10B which is an U-phase low-side switch. The second half bridge 30B includes a third switching element 10C which is a V-phase high-side switch and a fourth switching element 10D which is a V-phase low-side switch. The third half bridge 30C includes a fifth switching element 10E which is a W-phase high-side switch and a sixth switching element 10F which is a W-phase low-side switch.

The D-terminals of the first, third, and fifth switching elements 10A, 10C, and 10E are connected to the first input terminal $V_{in1}$. The S-terminals of the first, third, and fifth switching elements 10A, 10C, and 10E are connected to the D-terminals of the second, fourth, and sixth switching elements 10B, 10D, and 10F, respectively. The S-terminals of the second, fourth, and sixth switching elements 10B, 10D, and 10F are connected to the second input terminal $V_{in2}$. A connection node between the S-terminal of the first switching element 10A and the D-terminal of the second switching element 10B is connected to the first output terminal $V_{out1}$. A connection node between the S-terminal of the third switching element 10C and the D-terminal of the fourth switching element 10D is connected to the second output terminal $V_{out2}$. A connection node between the S-terminal of the fifth switching element 10E and the D-terminal of the sixth switching element 10F is connected to the third output terminal $V_{out3}$. The G- and S-terminals of the first to sixth switching elements 10A-10F are connected via a gate drive circuit 151 to a motor controller 152. The SUB terminals of the first to sixth switching elements 10A-10F are connected to the first input terminal $V_{in1}$.

Because the SUB terminal of each switching element is connected to the first input terminal $V_{in1}$, the potential of the SUB terminal of each switching element is equal to the potential of the positive terminal of the direct-current power supply 141 regardless of the operating state of the switching element. Therefore, when each switching element is in the off-state, a high electric field is not applied between the substrate and the channel region in the vicinity of the second ohmic electrode. Therefore, electrons which would otherwise be caused by impact ionization do not occur, and therefore, the trapping of electrons in the semiconductor multilayer structure can be reduced. When each switching element is in the on-state, a positive voltage bias is applied to the back electrode, and therefore, discharge of electrons trapped in the semiconductor multilayer structure can be accelerated. Therefore, current collapse can be reduced. Also, when each switching element is in the on-state, the back electrode is biased to a positive voltage, and therefore, the back electrode functions as a back gate, so that the channel is opened to a greater degree and therefore the on-state resistance can advantageously be reduced.

The inverter 30 thus configured can reduce current collapse peculiar to the GaN transistor, resulting in a low-loss power converter. As shown in FIG. 3, the potential of the SUB terminal of the GaN transistor is supplied from the direct-current power supply 141 connected to the first input terminal $V_{in1}$ of the inverter 30, and therefore, the loss in the inverter 30 can be reduced without adding an external power supply or increasing parts. While, in FIG. 3, the SUB terminal and Vin1 are connected together directly, the SUB terminal and Vin1 may be connected together via a resistor etc. Any connection may be established as long as the potential of the SUB terminal can be set to be higher than or equal to the potential of the D-terminal. It is not necessary to apply a bias voltage to the SUB terminals of all the switching elements, and a bias voltage may be applied to the SUB terminal of only a switching element(s) in which a high voltage is applied to the D-terminal and therefore significant current collapse occurs. A switching element in which current collapse does not cause a problem may not include a back electrode. A switching element including a MOS transistor may be used in combination.

Figure 4:
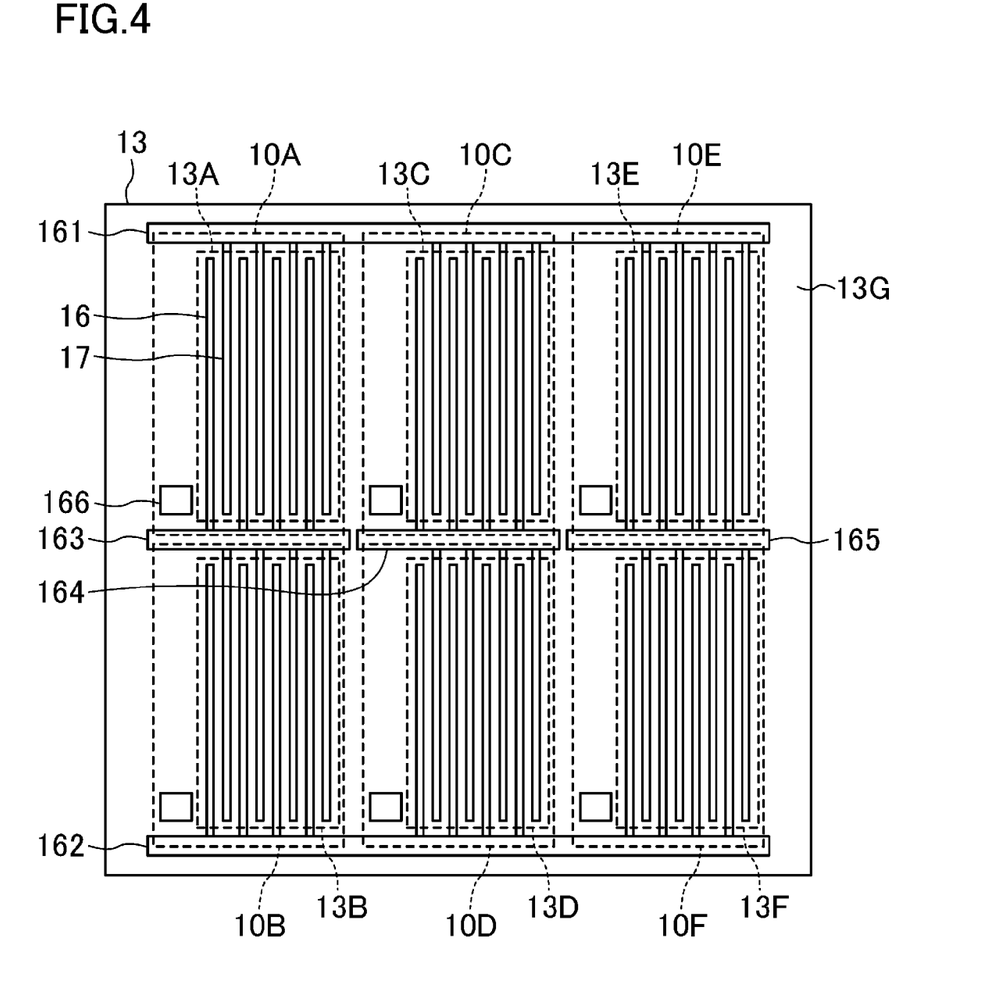
FIG. 4 is a plan view showing a one-chip inverter for use in the power converter of the variation of the embodiment.
Figure 5:
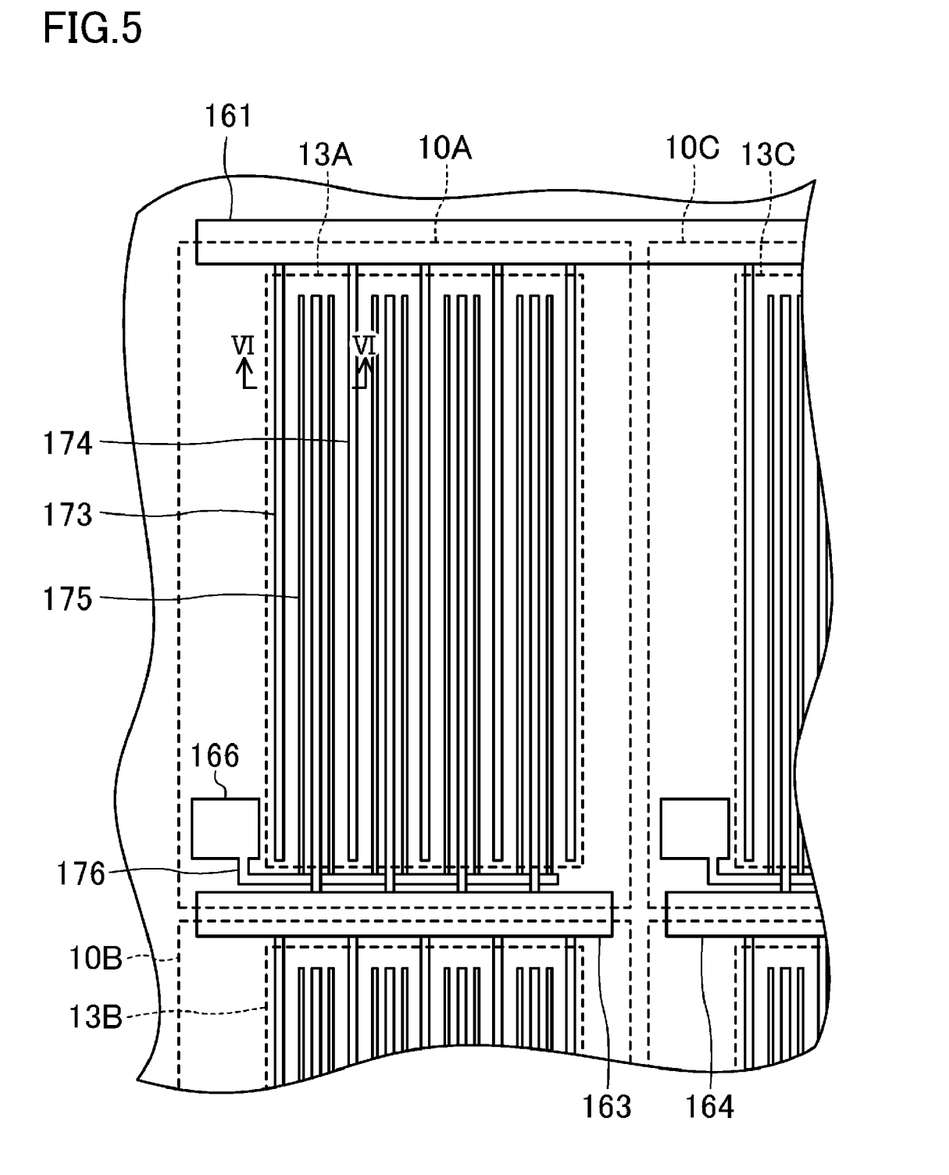
FIG. 5 is an enlarged plan view showing a main portion of the one-chip inverter of FIG. 4.
Figure 6:
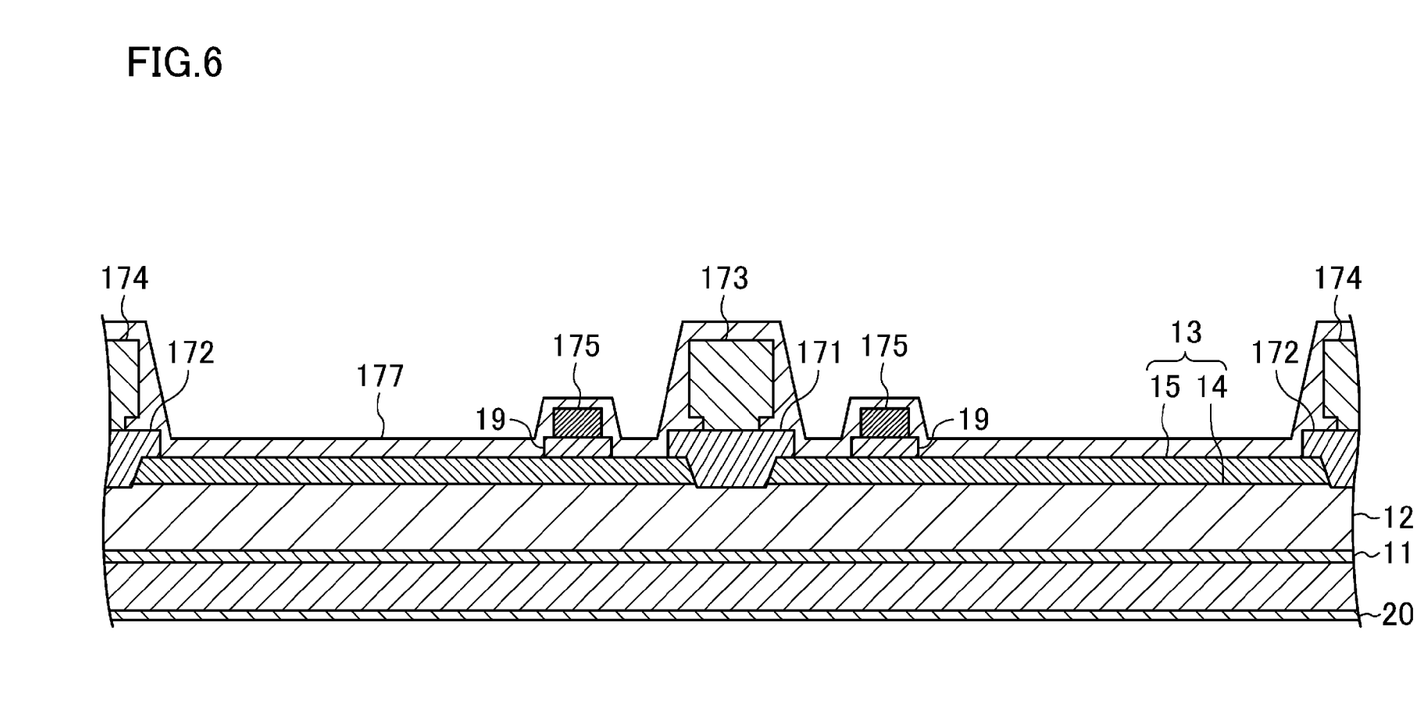
FIG. 6 is a cross-sectional view taken along line VI-VI of FIG. 5.

FIG. 4 is a plan view showing a configuration of a one-chip GaN inverter in which the power converter of this variation is integrated on a single chip. FIG. 5 is an enlarged view showing a portion of the first switching element 10A of FIG. 4. FIG. 6 is a cross-sectional view taken along line VI-VI of FIG. 5.

As shown in FIGS. 4-6, a first active region 13A, a second active region 13B, a third active region 13C, a fourth active region 13D, a fifth active region 13E, and a sixth active region 13F are formed in the semiconductor multilayer structure 13 formed on the substrate. The first to sixth active regions 13A-13F are each surrounded by a high-resistance inactive region 13G and are separated from each other. The first to sixth active regions 13A-13F are arranged in a matrix of two rows and three columns. The first to sixth active regions 13A-13F include the first to sixth switching elements 10A-10F, respectively.

A power supply line electrode 161 extending in the row direction is formed in the inactive region 13G laterally outside the first, third, and fifth active regions 13A, 13C, and 13E. The power supply line electrode 161 serves as the first input terminal $V_{in1}$ and is connected to the second ohmic electrodes 17 of the first, third, and fifth switching elements 10A, 10C, and 10E.

A ground line electrode 162 extending in the row direction is formed in the inactive region 13G laterally outside the second, fourth, and sixth active regions 13B, 13D, and 13F. The ground line electrode 162 serves as the second input terminal $V_{in2}$ and is connected to the first ohmic electrodes 16 of the second, fourth, and sixth active regions 13B, 13D, and 13F.

A first output electrode 163 is formed in the inactive region 13G between the first and second active regions 13A and 13B. A second output electrode 164 is formed in the inactive region 13G between the third and fourth active regions 13C and 13D. A third output electrode 165 is formed in the inactive region 13G between the fifth and sixth active regions 13E and 13F. The first output electrode 163 serves as the first output terminal $V_{out1}$ and is connected to the first ohmic electrode 16 of the first switching element 10A and the second ohmic electrode 17 of the second switching element 10B. The second output electrode 164 serves as the second output terminal $V_{out2}$ and is connected to the first ohmic electrode 16 of the third switching element 10C and the second ohmic electrode 17 of the fourth switching element 10D. The third output electrode 165 serves as the third output terminal $V_{out3}$ and is connected to the first ohmic electrode 16 of the fifth switching element 10E and the second ohmic electrode 17 of the sixth switching element 10F.

In each switching element, the first and second ohmic electrodes 16 and 17 each include a plurality of first ohmic fingers 171 and a plurality of second ohmic fingers 172. The first and second ohmic fingers 171 and 172 are alternately formed and spaced apart from each other at predetermined intervals. As shown in FIG. 6, a first ohmic electrode interconnect 173 is formed on the first ohmic finger 171, and a second ohmic electrode interconnect 174 is formed on the second ohmic finger 172. A gate finger 175 serving as the gate electrode 18 is formed on the p-type semiconductor layer 19 between the first and second ohmic fingers 171 and 172. The gate finger 175 is connected to a gate electrode interconnect 176. The gate electrode interconnect 176 is connected to a gate electrode pad 166.

A protective film 177 made of silicon nitride is formed on the semiconductor multilayer structure 13. Note that an opening for wire bonding is formed in a portion of the protective film 177 above each electrode pad.

If each switching element is formed as a single chip, pad electrodes for extracting a current from the source, gate, and drain electrodes need to be provided for each chip. Therefore, if an inverter includes 6 switching elements, 18 pad electrodes are required. The pad electrode requires a large area for wire bonding. Therefore, as the number of pad electrodes increases, the chip area increases. However, if all the switching elements are formed on a single chip, the pad electrodes can be shared. In FIG. 4, the power supply line electrode is shared as a common drain electrode pad by the high-side switches, and the ground line electrode is shared as a common source electrode pad by the low-side switches. Also, for each phase, an output electrode pad is shared as a source electrode pad and a drain electrode pad by the high-side switch and the low-side switch, respectively. Therefore, 11 pad electrodes can be removed, resulting in a reduction in the chip area. Also, only one back electrode is required, and therefore, only one interconnect for applying a potential to the back electrode is required. Therefore, compared to when a separate back electrode is provided on each chip, the interconnection structure can be simplified, resulting in a smaller-size and lower-cost inverter.

The power supply line electrode, the ground line electrode, and the first, second, and third output electrodes may be made of gold etc. The first and second ohmic electrode interconnects may also be made of gold etc. The gate electrode interconnect may be made of the same material as that of the gate electrode.

The above embodiment and variation show examples in which a conductive silicon substrate is used. Alternatively, any substrate on which a nitride semiconductor layer can be grown, such as a GaN substrate, a SiC substrate, etc., may be used.

The power converter of the present disclosure sufficiently reduces current collapse, utilizes the inherent low on-state resistance of the GaN transistor, and has low loss and high efficiency. Therefore, the power converter of the present disclosure is useful for inverters, DC-DC converters, etc.

What is claimed is:

1. A power converter comprising:
an input terminal configured to be connected to a power supply;
an output terminal; and
a first switching element coupled between the input terminal and the output terminal, wherein
the first switching element includes
a semiconductor multilayer structure formed on a substrate and made of a nitride semiconductor,
a gate electrode formed on the semiconductor multilayer structure,
a first and a second ohmic electrode formed on both sides of the gate electrode, and
a back electrode formed on a surface opposite to the semiconductor multilayer structure of the substrate,
when the first switching element is in the off-state, a potential difference between the second ohmic electrode and the back electrode is smaller than a potential difference between the second ohmic electrode and the first ohmic electrode, and
when the first switching element is in the on-state, a positive voltage bias is applied to the back electrode.

2. The power converter of claim 1, wherein
the potential of the back electrode which occurs when the first switching element is in the on-state is equal to the potential of the back electrode which occurs when the first switching element is in the off-state.

3. The power converter of claim 1, further comprising:
an inductor; and
a diode configured to be connected in series to the inductor, wherein
the power converter functions as a DC-DC converter which converts a voltage applied to the input terminal into a different voltage and outputs the resulting voltage through the output terminal.

4. The power converter of claim 3, wherein
the inductor is connected between the input terminal and the second ohmic electrode,
the diode is connected between a connection node between the inductor and the second ohmic electrode, and the output terminal, and
the power converter functions as a boost-up DC-DC converter which boosts a voltage applied to the input terminal and outputs the resulting voltage through the output terminal.

5. The power converter of claim 4, wherein
the back electrode is connected to the output terminal.

6. The power converter of claim 4, wherein
the back electrode is connected to the input terminal.

7. The power converter of claim 1, further comprising:
a half bridge,
wherein
the half bridge includes the first switching element and a second switching element connected the first switching element.

8. The power converter of claim 7, wherein
the second switching element has the same structure as that of the first switching element, and
the back electrodes of the first and second switching elements are connected to the input terminal.

9. The power converter of claim 7, further comprising:
a second and a third half bridge configured to be connected in parallel to the first half bridge,
wherein
the power converter functions as a motor drive inverter which drives a three-phase motor.

10. The power converter of claim 9, wherein
the second half bridge includes a third and a fourth switching element,
the third half bridge includes a fifth and a sixth switching element,
the second, third, fourth, fifth, and sixth switching elements each have the same structure as that of the first switching element, and
the back electrodes of the first, second, third, fourth, fifth, and sixth switching elements are connected to the input terminal.

11. The power converter of claim 9, wherein
the second half bridge includes a third and a fourth switching element,
the third half bridge includes a fifth and a sixth switching element,
the semiconductor multilayer structure has an inactive region, and active regions each surrounded by the inactive region and arranged in a matrix of two rows and three columns,
the first, second, third, fourth, fifth, and sixth switching elements are formed in the different respective active regions,
the second ohmic electrodes of the first, third, and fifth switching elements are integrally formed,
the first ohmic electrodes of the second, fourth, and sixth switching elements are integrally formed,
the first ohmic electrode of the first switching element and the second ohmic electrode of the second switching element are integrally formed,
the first ohmic electrode of the third switching element and the second ohmic electrode of the fourth switching element are integrally formed, and
the first ohmic electrode of the fifth switching element and the second ohmic electrode of the sixth switching element are integrally formed.

* * * * *